US006696335B2

United States Patent
Bonart et al.

(10) Patent No.: US 6,696,335 B2
(45) Date of Patent: Feb. 24, 2004

(54) METHOD FOR FORMING A DIFFUSION REGION

(75) Inventors: Dietrich Bonart, München (DE); Peter Voigt, Hallbergmoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,735

(22) Filed: Jul. 31, 2002

(65) Prior Publication Data

US 2003/0060029 A1 Mar. 27, 2003

(30) Foreign Application Priority Data

Jul. 31, 2001 (DE) .......................................... 101 37 341

(51) Int. Cl.[7] .......................................... H01L 21/8242
(52) U.S. Cl. ........................ 438/242; 438/270; 438/545
(58) Field of Search ................. 438/242, 243, 438/244, 270, 386, 387, 545

(56) References Cited

U.S. PATENT DOCUMENTS 6,121,651 A * 9/2000 Furukawa et al. .......... 257/296
6,190,971 B1 * 2/2001 Gruening et al. ........... 438/270
6,339,241 B1 * 1/2002 Mandelman et al. ....... 438/242
6,441,422 B1 * 8/2002 Mandelman et al. ....... 257/300

OTHER PUBLICATIONS

Chen, N. K. et al.: Oxynitridation–Enhanced Diffusion of Phosphorus in <100> Silicon, J. Electrochem. Soc., vol. 142, No. 6, Jun. 1995, pp. 2051–2054.

Liu, D.–G. et al.: "Anomalous Diffusion of Boron in Silicon Driven Under the $N_2O$ Ambient", IEEE, vol. 21, No. 21, Dec. 2000, pp. 572–574.

* cited by examiner

Primary Examiner—Chandra Chaudhari
(74) Attorney, Agent, or Firm—Laurence A. Greenberg; Werner H. Stemer; Gregory L. Mayback

(57) ABSTRACT

For particularly simple and targeted formations of a diffusion region, an interfacial region of a semiconductor substrate is subjected to a thermal transformation process and thereby carry out the thermally activated diffusion of a dopant in a substantially directed form, in particular in substantially a preferential direction, by interaction of a provided dopant with a transforming interfacial region.

31 Claims, 6 Drawing Sheets

METHOD FOR FORMING A DIFFUSION REGION

BACKGROUND OF THE INVENTION

FIELD OF THE INVENTION

The invention relates to a method for forming a diffusion region and in particular to a method for forming a diffusion contact or the like in a semiconductor substrate and in particular for connecting a DRAM memory cell to a vertical MOSFET or the like.

In the case of integrated semiconductor circuits, a large number of components bearing different functions are formed in a very confined space in a semiconductor substrate or the like. In this case, various components must either be connected to one another or adequately insulated from one another.

Certain contacts are made for example as diffusion contacts. In this case, a region of the semiconductor substrate that is initially non-conducting is prestructured and then locally enriched in a targeted manner by a dopant in a doping operation, to thereby increase the conductivity locally in the initially non-conducting subregion of the semiconductor substrate by introducing corresponding charge carriers.

The disadvantage of forming contacts of this type by a diffusion process is that the diffusion process as such generally proceeds more or less isotropically. Therefore, a locally introduced high dopant concentration spreads more or less uniformly in all spatial directions during the thermal outdiffusion or annealing. To be able nevertheless to use the formation of contact regions by diffusion, it is necessary to introduce in the semiconductor substrate a minimum distance between components which absolutely have to be insulated or to form an additional electrical insulation, for example in the form of an oxide region, in order that unwanted instances of contacting or even short circuits are avoided.

The provision of an additional insulating region, for example in the form of an oxide or the like, hinders the individual process steps and consequently increases the costs of production. The maintenance of minimum distances is at odds with the aim and desire of making integrated semiconductor circuits as highly integrated and effective as possible.

SUMMARY OF THE INVENTION

It is accordingly an object of the invention to provide a method for forming a diffusion region that overcomes the above-mentioned disadvantages of the prior art methods of this general type, in which the risk of unwanted instances of contacting or short circuits is particularly low.

With the foregoing and other objects in view there is provided, in accordance with the invention, a method for forming a diffusion region. The method includes providing a semiconductor substrate, and forming a first conductivity region and a second conductivity region in the semiconductor substrate. The first conductivity region and the second conductivity region are spatially separated from each other by an intermediate region of the semiconductor substrate. The diffusion region is formed between the first conductivity region and the second conductivity region in the intermediate region by thermally activated diffusion of at least one dopant into the intermediate region. The thermally activated diffusion of the dopant is conducted substantially in a directed manner by an interaction of the dopant with a subregion of the intermediate region. A transformation process is thermally initiated at least in the subregion of the intermediate region.

In the case of the method according to the invention for forming the diffusion region, in particular a diffusion contact or the like, in a semiconductor substrate or the like, in particular for connecting a DRAM memory cell on a vertical MOSFET, a first conductivity region and a second conductivity region are spatially separated from each other by an intermediate region of the semiconductor substrate. The diffusion region or the diffusion contact is formed between the first conductivity region and the second conductivity region, in particular in the intermediate region. The forming of the diffusion region or the diffusion contact takes place by thermally activated diffusion of at least one dopant into the intermediate region of the semiconductor substrate. Furthermore, a transformation process is thermally initiated and/or conducted at least in a subregion of the intermediate region, in particular substantially at the same time as the diffusion, and the thermally activated diffusion of the dopant is thereby carried out substantially in a directed manner, in particular substantially in or along a preferential direction, by interaction of the dopant with the transforming subregion of the intermediate region.

A central idea of the present invention is consequently to control the direction of the thermally activated diffusion of the dopant particles by bringing the dopant particles into specific interaction with the subregion of the intermediate region. The interaction is carried out by initiating and conducting a transformation process of the subregion of the intermediate region. By initiating the transformation processes by thermal activation, the corresponding interaction of the dopant particles with the subregion of the intermediate region and the material present there is also achieved at the same time.

More preferably, a chemical transformation process, a crystallization process and/or the like is/are carried out as the transformation process in the subregion of the intermediate region of the semiconductor substrate.

In this case, an oxidation operation is particularly preferred, in particular an oxidation operation using oxygen or with oxygen.

A particularly strong influence of the transformation process in the subregion of the intermediate region is obtained if, according to a preferred embodiment of the method according to the invention for forming a diffusion region, lattice imperfections, reactive centers and/or the like are produced, provided with increased mobility and/or brought into interaction with the dopant particles by the transformation process.

This measure consequently achieves the particular effect that both the mobility of the dopant particles and the mobility of possible lattice imperfections are increased by thermal activation. As a result, the probabilities of certain mass transfers, for example exchange processes or the like, can be correspondingly increased.

In the case of a particularly preferred embodiment of the method according to the invention, a silicon substrate, in particular a bulk silicon substrate, a p-doped silicon or the like, is provided as the semiconductor substrate, as the intermediate region and/or as the subregion thereof.

In the case of a further embodiment of the method according to the invention, the dopant is chosen to match the material of the intermediate region or of the semiconductor substrate and in particular to match the material of the subregion of the intermediate region, in particular with regard to a particularly high mobility of the dopant particles or of the dopant with respect to a preferential direction.

Particularly advantageous properties are obtained if phosphorus or the like is chosen as the dopant. Phosphorus has, for example in comparison with arsenic, a much stronger tendency to interact with lattice imperfections. It is therefore much easier with phosphorus, in comparison with arsenic or the like, to accomplish a directed diffusion along a preferential direction by local forming of mobile lattice imperfections.

Although the dopant can be introduced subsequently into already existing structures, for example locally by corresponding implantation or the like, it is of particular advantage if the dopant is supplied by a depot region, in particular in the semiconductor substrate. The depot region is advantageously created as a material subregion during the production of the basic structures and is then distributed in a desired way during the thermal outdiffusion from the depot region in a directed manner while interacting with the thermal transformation region.

In this case, the depot region may be provided as a separate region in the region of the semiconductor substrate.

It is also conceivable for the depot region to be provided in substantially direct spatial proximity to the first conductivity region, the subregion and/or intermediate region of the semiconductor substrate and/or the second conductivity region.

In the case of a particularly advantageous embodiment of the method according to the invention, the depot region is formed and provided as the first conductivity region or as part thereof, in particular as what is known as a buried-strap region or the like.

In the case of a particularly preferred embodiment of the method according to the invention, a polysilicon region or the like is respectively provided as the first conductivity region and/or as the second conductivity region.

According to another preferred embodiment of the method according to the invention, it is provided that an interfacial region or edge region of the semiconductor substrate or of the intermediate region thereof, in particular with respect to a neighboring medium, is provided as a subregion for the transformation process, in particular in substantially direct connection, in particular along a preferential direction, between the first conductivity region and the second conductivity region.

In this case, a medium having an oxidizing agent and/or a medium supplying an oxidizing agent is provided in an advantageous way as the neighboring medium, in particular an oxygen-containing atmosphere or the like.

With regard to the distribution of the dopant in a directed form, it is of particular advantage that, during the transformation process, a substantially electrically insulating interfacial region and/or edge region, which contains in particular an oxide, a silicon oxide and/or the like, is formed in the subregion.

It is further of advantage that, after the transformation process, a third conductivity region is provided in the direct proximity of the subregion of the intermediate region or of the semiconductor substrate in such a way that a gate region which can be driven via the third conductivity region is formed by the subregion and/or the interfacial region between the first conductivity region and the second conductivity region with the diffusion region or diffusion contact as a connection contact, in particular in the form of a vertical MOSFET or the like.

In this case, the first conductivity region is provided in an advantageous way as a line device, a top electrode device, in particular of a storage capacitor or the like, as a buried-strap region (BS region) and/or as part thereof or a combination thereof.

In the case of another embodiment, the second conductivity region is advantageously formed as part of a bit line or word line.

In a corresponding way, the depot region for the dopant may be provided as part of a top electrode region, of a buried-strap region (BS region) or the like, in particular as a BS-divot-fill region or the like.

The connection of trench memory cells to MOSFETs disposed above them and vertically aligned requires that a diffusion region or diffusion contact is produced. The diffusion region must on the one hand have an adequate material overlap with the gate region or gate oxide of the vertical MOSFET and on the other hand be horizontally localized and restricted on account of the proximity of further elements of the circuit configuration which must not be contacted.

Until now, arsenic-doped polysilicon has been used for contacting in the outdiffusion of the buried-strap region, the arsenic provided forming the corresponding dopant. The dopant diffuses to the same degree in vertical and horizontal directions, so that, when spanning a vertical distance to form the overlap with respect to the gate of the vertical MOSFET, a corresponding diffusion distance is substantially also covered in the lateral direction to neighboring circuit elements which, however, are not to be contacted. To actually avoid undesired contacting, it is therefore necessary to provide correspondingly large distances between neighboring elements of the circuit configuration between which contacting must not occur.

In particular, the use of phosphorus-doped polysilicon in the upper region of the trench cell with subsequent thermally oxidative production of the gate dielectric of the vertical MOSFET allows an anisotropic diffusion to develop. Consequently, the overlap with respect to the gate can be significantly improved, the lateral outdiffusion in the direction of circuit elements which are not to be contacted remaining limited at the same time on account of the reduced necessary diffusion time.

In an advantageous way, phosphorus is consequently introduced in the upper part of a DRAM trench cell and the contact with the vertical MOSFET lying above it is established by utilizing the effect of what is known as oxidation-enhanced diffusion.

Other features which are considered as characteristic for the invention are set forth in the appended claims.

Although the invention is illustrated and described herein as embodied in a method for forming a diffusion region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
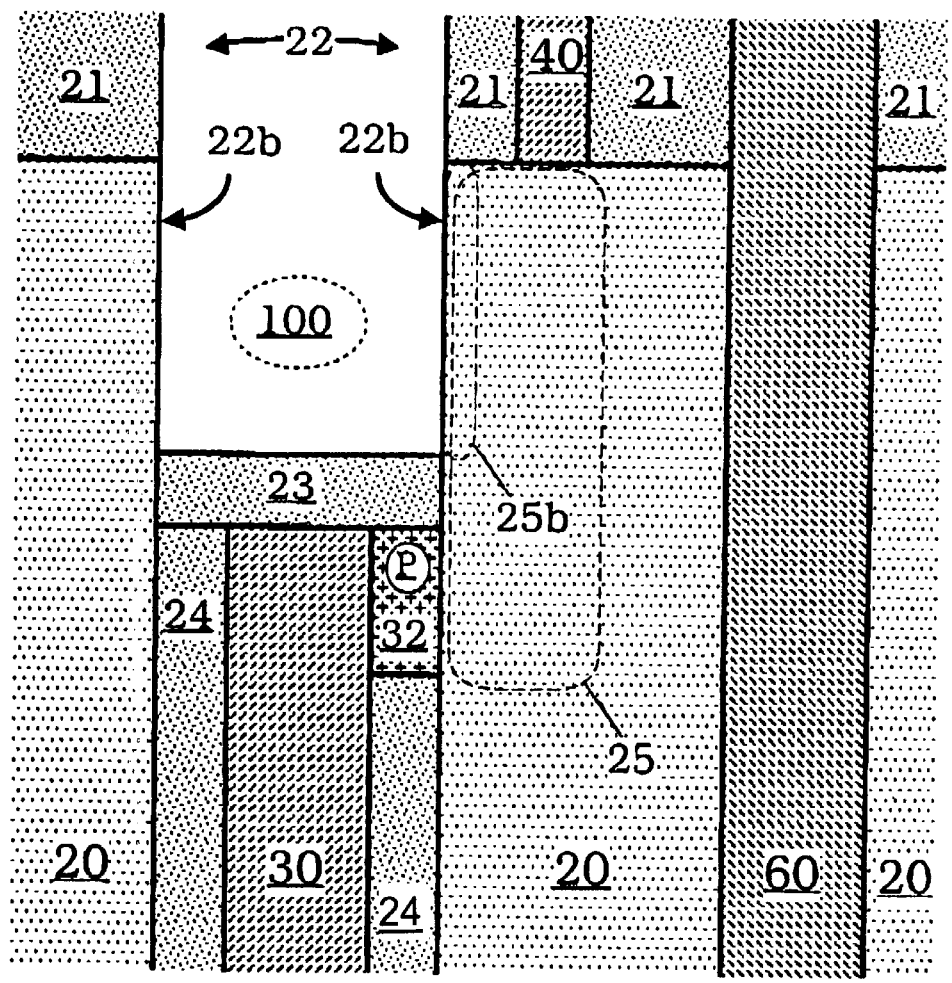
FIGS. 1–3 are diagrammatic, lateral cross-sectional views of two structures that are obtained in the case of an exemplary embodiment of a method according to the invention.

Referring now to the figures of the drawing in detail and first, particularly, to FIG. 1 thereof, there is shown a starting point for forming a diffusion region 50 or diffusion contact 50 in the way according to the invention in a lateral cross-sectional view.

In a semiconductor substrate 20, for example a p-doped bulk silicon or the like, a first conductivity region 30 is formed in a trench 22, for example in the form of polycrystalline silicon or the like. The first conductivity region 30 may be, for example, a connecting lead, or else, as in the case of a DRAM cell with a vertical cell structure, the lead to a top electrode of a capacitor device to be provided further down in the structure.

At a vertical distance away from the first conductivity region 30 is a second conductivity region 40, which may be formed for example as part of a word line or bit line. Provided between the first conductivity region 30 and the second conductivity region 40 is an intermediate region 25 of the semiconductor substrate 20. In the intermediate region 25, the diffusion region 50 or diffusion contact 50 is to be produced by introducing a dopant P. The diffusion region 50 or the diffusion contact 50 serves for the direct and/or switchable contacting—for example by channel-forming over a channel path or gate path K—of the first conductivity region 30 with the second conductivity region 40.

The first conductivity region 30 is electrically insulated laterally with respect to the semiconductor substrate 20 by a first insulating region 24. The first insulating region 24 may also serve as an oxide collar or collar region, to suppress the forming and switching of parasitic semiconductor switching elements.

In the upward direction, the first conductivity region 30 is electrically insulated by a second insulating region 23 and closed off with respect to the trench 22. The second insulating region 23 is often also referred to as the trench top oxide (TTO) and serves for the electrical insulation of the first conductivity region 30 from a gate terminal 70 to be formed in the trench 22.

Next to the upper side region of the first conductivity region 30, in the first insulating region 24 there is a recess that is filled with a polysilicon region 32 doped with a dopant p (FIG. 2) forming a depot region 32. The depot region 32 is referred to in the case of vertical DRAM cell configurations as a buried-strap region, the filling itself as a BS-divot-fill region. It serves decisively for the forming of the diffusion region 50 by an outdiffusion of the doping material P into the region of the semiconductor substrate 20.

The configuration of FIG. 1 is the starting point of the method according to the invention. A similar configuration is the starting point in conventional methods for forming diffusion regions. There, the BS-divot-fill region 32 is, for example, undoped polysilicon, and the first conductivity region 30 is arsenic-doped polysilicon.

This provision is intended to explain initially the conventional procedure when forming diffusion regions or diffusion contacts.

Figure 4:
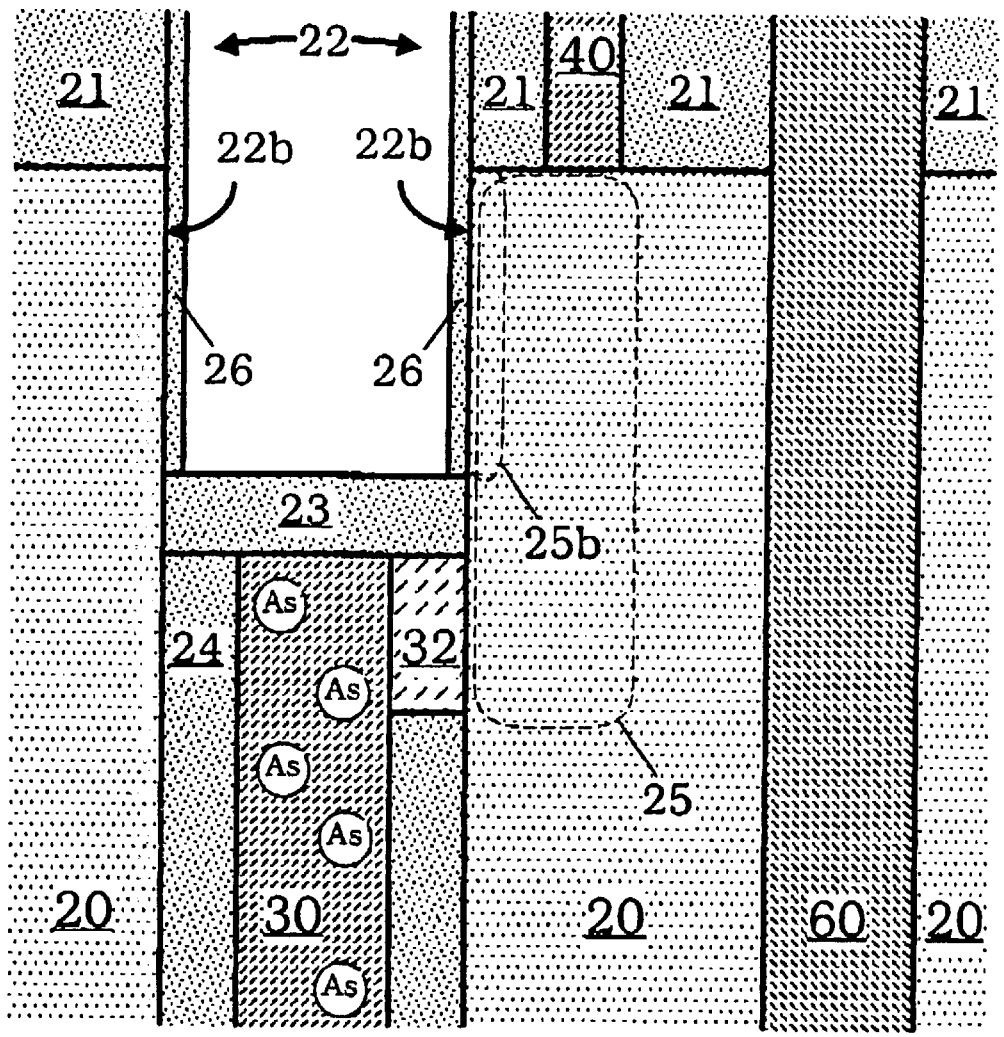
FIGS. 4–6 are diagrammatic, side-sectional views of intermediate stages that are achieved with the forming of conventional diffusion regions.

In the transition to the structure just described to the structure of FIG. 4, a third insulating region 26 is formed at side wall regions 22b of the trench 22, for example in the form of an oxide or the like, which then serves later as the gate oxide, as it is known.

Figure 5:
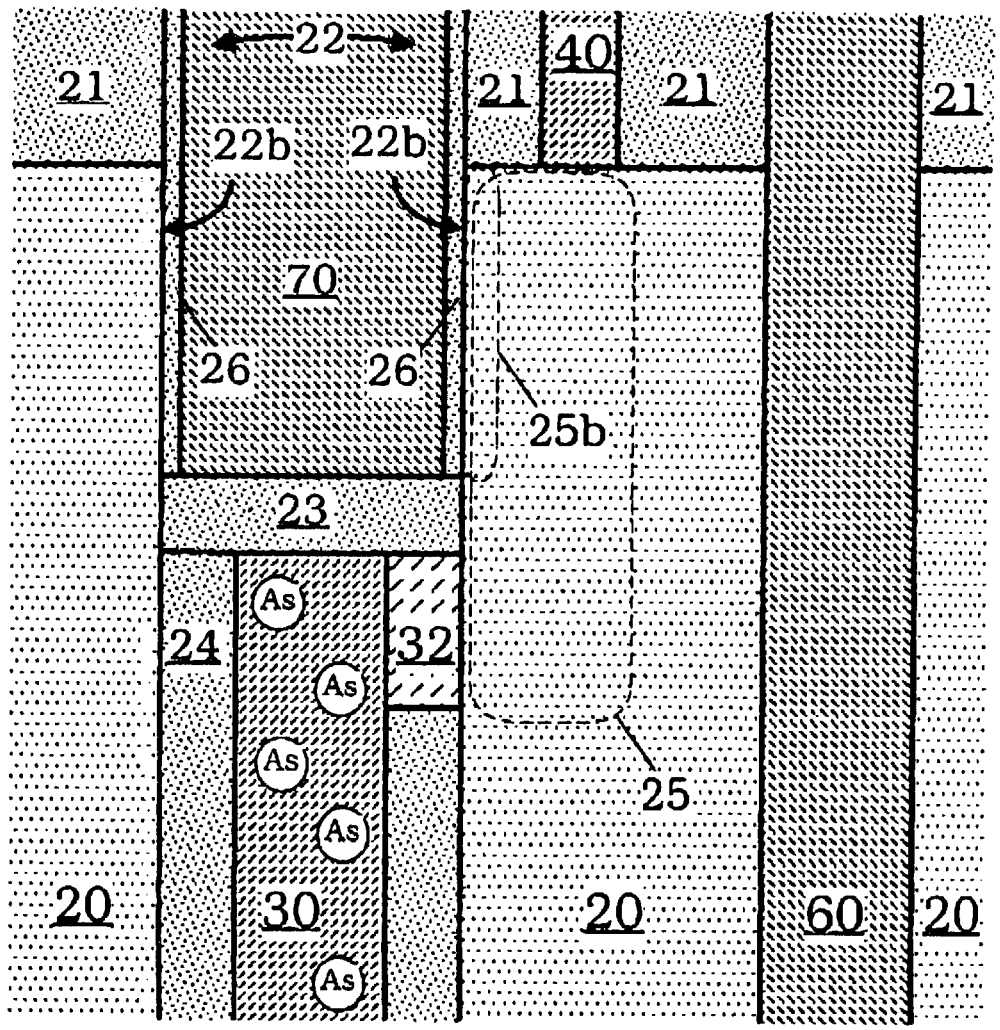

In the transition to the configuration of FIG. 5, the still exposed recess of the trench 22 is then filled with what is known as the gate terminal 70.

Figure 6:
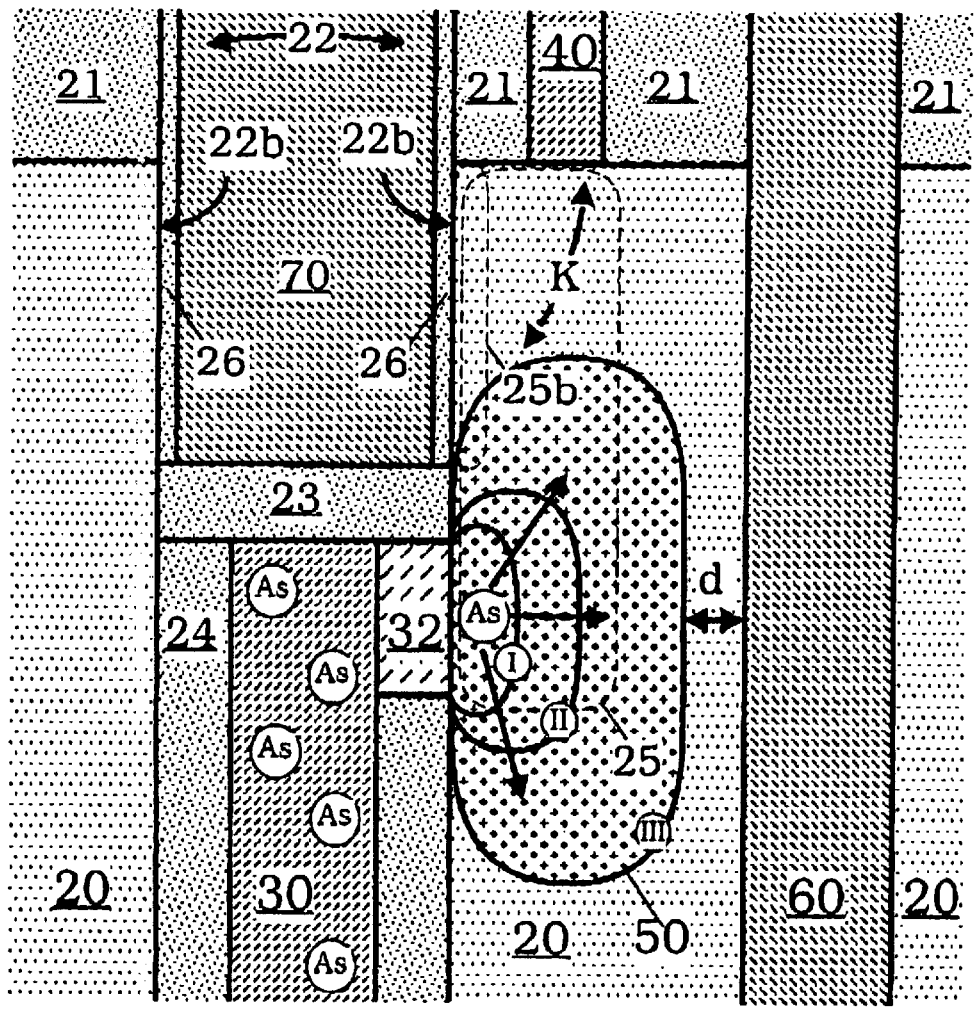

Then, in the transition to the structure of FIG. 6, an annealing process, which possibly involves a number of steps, is carried out, in which process the entire configuration of FIG. 5 is heated and thereby brings about the outdiffusion of the doping material P of the depot region 32 into the region of the semiconductor substrate 20.

In FIG. 6, the diffusion fronts I, II and III at three different successive points in time of the diffusion operation are represented. It can be clearly seen that, although a vertical diffusion of the dopant P, starting from the depot region 32, into the intermediate region 25 and towards the second conductivity region 40 takes place for the forming of the local diffusion region 50, it can nevertheless also be seen that a lateral diffusion in the direction of the arrows also takes place, in the direction of a third conductivity region 60 that is provided. The third conductivity region 60 serves for illustrating by way of example the presence of further switching elements which are to be electrically insulated with respect to the first conductivity region 30 or the second conductivity region 40 to ensure a desired functionality of the configuration.

It can be seen more clearly that, as a result of the lateral outdiffusion of the dopant p from the depot region 32 toward the third conductivity region 60, the insulating region between the diffusion region 50 and the further conductivity region 60, which indeed is not to be contacted, has the relatively low value d, so that, in the case of the configuration of FIG. 6, there is a considerable risk of electrical contacts forming between the first conductivity region 30 and the third conductivity region 60.

In the case of the procedure according to the invention, on the other hand, starting from the configuration of FIG. 1, the gate oxide region 26 is not explicitly deposited. Instead, with the trench 22 open and in the presence of an oxygen-containing atmosphere as a neighboring medium 100 (FIG. 2) of the intermediate region 25 or edge region 25b thereof, a thermal transformation operation is initiated by heating up the entire structure of FIG. 1. The transformation operation preferably takes place in an edge region 25b of the semiconductor substrate 20 or of the intermediate region 25 of p-doped polysilicon.

Figure 2:
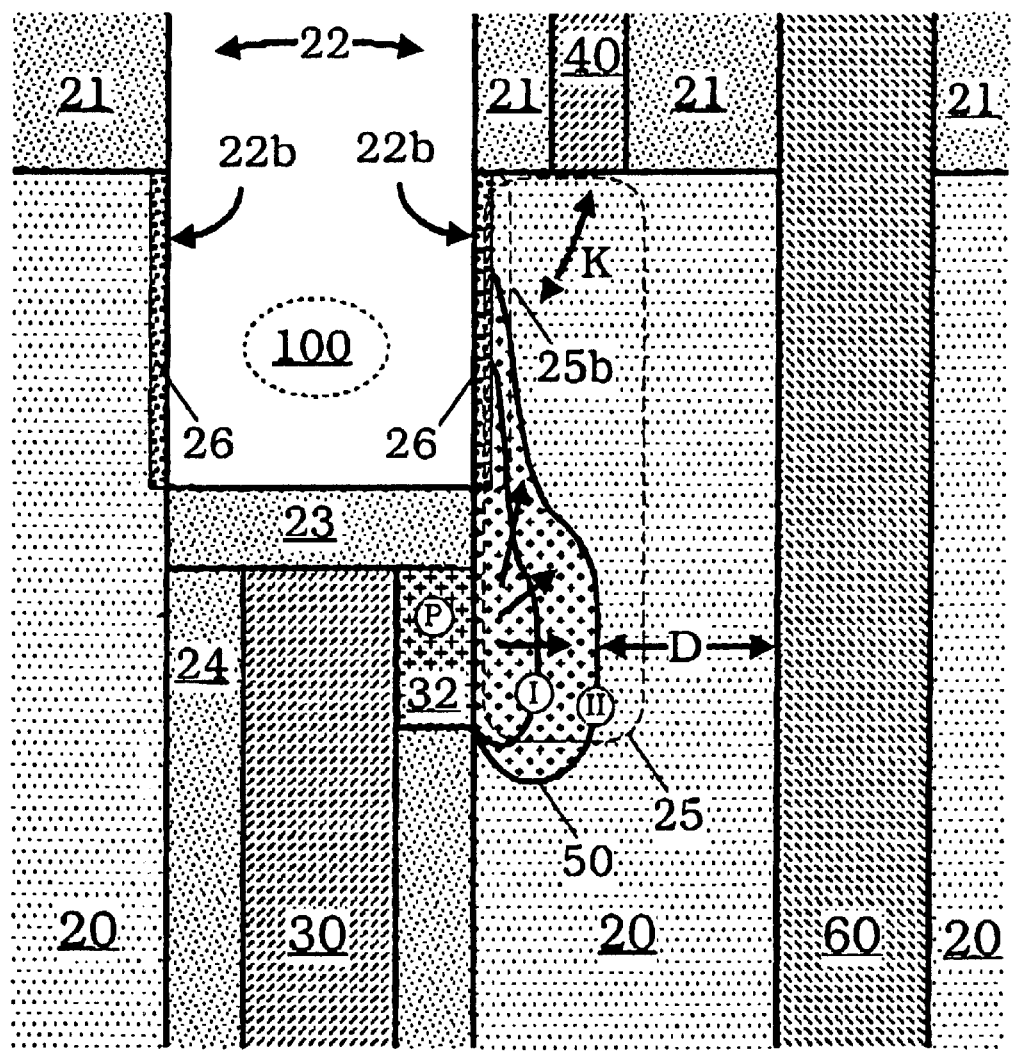

At the same time, in the transition to the structure of FIG. 2, the outdiffusion of the dopant p then takes place from the depot region 32 into the region of the semiconductor substrate 20.

In a way analogous to the intermediate state shown in FIG. 6, it is also the case with the configuration of FIG. 2 that various diffusion fronts I, II which are assigned successively at different points in time of the diffusion process are represented. As in the case of the configuration of FIG. 6, a marked lateral outdiffusion of the dopant p from the depot region 32 towards the third conductivity region 60 also takes place in the case of the procedure according to FIG. 2.

On account of the oxidation operation in the edge region 25b and the accompanying production and/or mobilization of lattice imperfections, an intensive interaction of the dopant particles P with the lattice imperfections of a transformation region 22b takes place in particular, so that the dopant P has a greater mobility in the vertical direction along the edge region 25b than in the lateral direction toward the third conductivity region 60. As a consequence, in comparison with the configuration of FIG. 6, the dopant P spreads out more easily in the vertical direction than in the lateral direction. As a consequence, the annealing process, and consequently the diffusion operation, may already be interrupted when the diffusion front II is reached, that is at a very much earlier point in time, because there is then already a marked overlap of the diffusion region 50 with the oxide region 22b formed up until then as the transformed subregion 25b.

This aspect is illustrated by a depicted distance D between the diffusion region or diffusion contact 50 and the third conductivity region 60. The distance D is very much greater than the corresponding distance d of the configuration of FIG. 6.

The limit of the diffusion contact or diffusion region 50 is defined by the front II, and the limit corresponds accordingly to the limit of a pn junction. In the upper region of the diffusion contact or diffusion region 50, a corresponding channel path K must then be formed in the direct proximity of the second conductivity region 40 by corresponding application of an electric potential.

Figure 3:
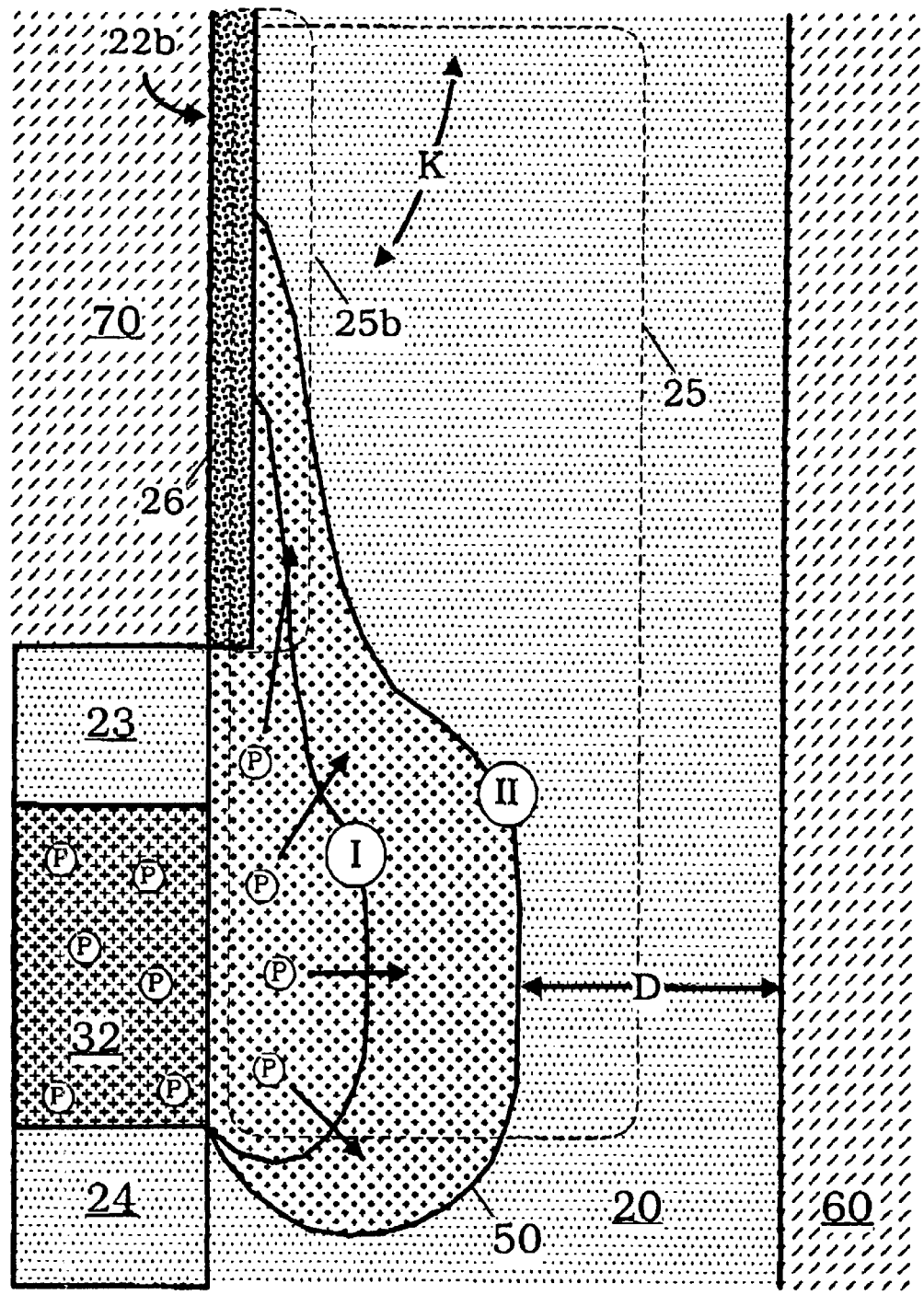

FIG. 3 shows in greater detail the configuration of FIG. 2 in the region of the diffusion region 50, with the filling of the trench 22 with a corresponding gate contact region in the form of the gate terminal 70 also already being represented.

We claim:

1. A method for forming a diffusion region, which comprises the steps of:
providing a semiconductor substrate;
forming a first conductivity region and a second conductivity region in the semiconductor substrate, the first conductivity region and the second conductivity region being spatially separated from each other by an intermediate region of the semiconductor substrate;
forming the diffusion region between the first conductivity region and the second conductivity region in the intermediate region by thermally activated diffusion of at least one dopant into the intermediate region, the thermally activated diffusion of the dopant conducted substantially in a directed manner by interaction of the dopant with a subregion of the intermediate region; and
initiating thermally a transformation process at least in the subregion of the intermediate region.

2. The method according to claim 1, which comprises carrying out at least one of a chemical transformation process and a crystallization process as the transformation process of the subregion.

3. The method according to claim 1, which comprises carrying out an oxidation process as the transformation process of the subregion.

4. The method according to claim 1, which comprises during the transformation process lattice imperfections and reactive centers are produced and provided with increased mobility and brought into contact with dopant particles by the transformation process.

5. The method according to claim 1, which comprises providing a silicon substrate for forming the semiconductor substrate, the intermediate region and the subregion.

6. The method according to claim 1, which comprises choosing the dopant to match a material of the semiconductor substrate and the intermediate region with regard to a particularly high mobility of the dopant in a preferential direction.

7. The method according to claim 1, which comprises using phosphorus as the dopant.

8. The method according to claim 1, which comprises supplying the dopant using a depot region.

9. The method according to claim 8, which comprises forming the depot region as a separate region in the semiconductor substrate.

10. The method according to claim 8, which comprises forming the depot region in a substantially direct spatial proximity to at least one of the first conductivity region, the intermediate region of the semiconductor substrate and the second conductivity region.

11. The method according to claim 8, which comprises forming the depot region as a part of the first conductivity region.

12. The method according to claim 1, which comprises forming the first conductivity region as a polysilicon region.

13. The method according to claim 1, which comprises forming the subregion as one of an interfacial region and an edge region of the intermediate region and the subregion borders a neighboring medium, the subregion disposed between the first conductivity region and the second conductivity region.

14. The method according to claim 13, which comprises providing the neighboring medium as a medium one of having an oxidizing agent and supplying the oxidizing agent.

15. The method according to claim 1, which comprises during the transformation process, a substantially electrically insulating interfacial region containing at least one of an oxide and a silicon oxide is formed in the intermediate region.

16. The method according to claim 15, which comprises after the transformation process, forming a gate terminal in direct proximity to the intermediate region of the semiconductor substrate in such a way that a gate region which can be driven via the gate terminal is formed by the intermediate region of the semiconductor substrate and by the interfacial region between the first conductivity region and the second conductivity region with the diffusion contact functioning as a connection contact region.

17. The method according to claim 1, which comprises forming the first conductivity region as a device selected from the group consisting of line devices, top electrode devices, storage capacitor electrodes, buried-strap regions and combinations thereof.

18. The method according to claim 1, which comprises forming the second conductivity region as part of at least one of a bit line device and a word line device.

19. The method according to claim 8, which comprises forming the depot region for the dopant as part a device selected from the group consisting of a top electrode region, a buried-strap region, and a BS-divot-fill region.

20. The method according to claim 1, which comprises forming a depot region in the semiconductor substrate for supplying the dopant from the depot region.

21. The method according to claim 5, which comprises selecting the silicon substrate from the group consisting of bulk silicon substrates and p-doped silicon substrates.

22. The method according to claim 3, which comprises using oxygen during the oxidation process.

23. The method according to claim 1, which comprises forming the diffusion region as a diffusion contact for connecting a DRAM memory cell to a vertical MOSFET.

24. The method according to claim 1, which comprises performing the thermally activated diffusion substantially at a same time as the transformation process.

25. The method according to claim 1, which comprises performing the transformation process substantially in a preferential direction in regards to the interaction of the dopant with the subregion.

26. The method according to claim 11, which comprises forming the depot region as a buried-strap region.

27. The method according to claim 1, which comprises forming the second conductivity region as a polysilicon region.

28. The method according to claim 1, which comprises forming the first conductivity region and the second conductivity region as polysilicon regions.

29. The method according to claim 1, which comprises placing the subregion in a substantially direct connection in a preferential direction between the first conductivity region and the second conductivity region.

30. The method according to claim 14, which comprises forming the neighboring medium as an oxygen-containing atmosphere.

31. The method according to claim 16, which comprises forming the connection contact region in a form of a vertical MOSFET.

* * * * *